(12) United States Patent
Rottacker et al.

(10) Patent No.: US 7,355,378 B2
(45) Date of Patent: Apr. 8, 2008

(54) SOURCE SYNCHRONOUS SAMPLING

(75) Inventors: Markus Rottacker, Stuttgart (DE); Bernd Laquai, Stuttgart (DE); Klaus-Peter Behrens, Gaertringen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 144 days.

(21) Appl. No.: 11/234,447

(22) Filed: Sep. 23, 2005

(65) Prior Publication Data
US 2006/0114978 A1   Jun. 1, 2006

(30) Foreign Application Priority Data
Oct. 27, 2004   (EP)   ................................ 04105327

(51) Int. Cl.
  *G01R 13/34*   (2006.01)
  *H04L 7/00*   (2006.01)
(52) U.S. Cl. .................................... 324/76.42; 375/354
(58) Field of Classification Search ............. 324/76.42; 375/354
See application file for complete search history.

(56) References Cited
U.S. PATENT DOCUMENTS 5,636,254 A * 6/1997 Hase et al. ................. 375/371
5,761,216 A   6/1998 Sotome et al. ............. 371/27.1
6,791,360 B2 * 9/2004 Gauthier et al. ............ 326/93
2005/0080580 A1 * 4/2005 Kantake ...................... 702/117

FOREIGN PATENT DOCUMENTS

WO   WO2004/025891   3/2004

* cited by examiner

*Primary Examiner*—Andrew H. Hirshfeld
*Assistant Examiner*—Timothy J Dole
(74) *Attorney, Agent, or Firm*—Ohlandt, Greeley, Ruggiero & Perle, L.L.P.

(57)   ABSTRACT

There is provided a method of source synchronous sampling, where a first clock signal of a first unit is synchronized to a second signal received from a second unit. The method includes determining a timing control signal on the base of the first clock signal and the second signal, generating an adjusted clock signal by adjusting the timing of the first clock signal corresponding to the timing control signal, and using the adjusted clock signal for sampling a signal received from the second unit. The second signal is a clock signal received from the second unit, the adjusted clock signal is used for sampling this clock signal itself, and a corresponding sampled clock signal is supervised to show proper clock functionality.

15 Claims, 3 Drawing Sheets

SOURCE SYNCHRONOUS SAMPLING

BACKGROUND ART

The present invention relates to synchronizing a sampling signal to a clock signal.

Integrated Circuits (IC) need to be tested to assure proper operation. During test, the IC, as a device under test (DUT), is exposed to stimulus data signals of an Automatic Test Equipment (ATE). The IC transmits corresponding response data back to the ATE. The ATE measures, processes and usually compares this response data with expected responses. The ATE usually performs these tasks according to a device-specific test program.

ATE's with decentralized resources based on a per-pin architecture are known, wherein during test, each pin of a multiple of pins of the DUT is connected to one ATE pin electronic. These ATE's further comprise central resources, in particular for controlling the sequence and timing of applied test stimulus vectors. The per-pin architecture generally enables high performance and scalability. Examples for ATE with per-pin architecture are the Agilent 83000 and 93000 families of Semiconductor Test Systems of Agilent Technologies. Details of those families are also disclosed e.g. in EP-A-859318, EP-A-864977, EP-A-886214, EP-A-882991, U.S. Pat. No. 5,499,248 and U.S. Pat. Nos. 5,453,995.

A digital data signal comprises a stream of discrete values or data. In the case of binary data, the signal represents a certain sequence of two values, e.g. of the values "0" and "1", wherein the values are represented each by a pulse having a certain format e.g. having a return-to-zero (RZ) format or a non-return-to-zero (NRZ) format, and a certain length. (As simple example for an NRZ format, the signal takes a first constant value for a "0" and a second constant value for a "1". For recovering the data of the digital signal at a receiver, it is necessary to know the timing of the digital signal, i.e. to know the length of each pulse (=clock frequency) and the beginning of each pulse (=clock phase) to be able to correctly sample the received data stream. Thus, clock information has to be exchanged between data sender and receiver.

Traditionally, the data signal sender transmits additionally a clock signal having a frequency corresponding to the bit rate of the transmitted data and a phase corresponding to the timing of the bit edges. This clock is used at receiver's side either directly to sample the received signal or to adjust a receiver's clock for sampling the received signal. In the latter case, the frequency of the clock signal may have a fraction or a multiple of the bit rate.

A problem of synchronization is that the data and clock signals are affected by disturbances that might lead to phase drift or phase jitter. Due to the high data speed in modern test systems, small deviations of the receiving clock with respect to the sending clock might already lead to an erroneous recovery of the received signal.

DISCLOSURE

It is an object of the invention to provide an advanced method for clock synchronization. The object is solved by the independent claims. Further embodiments are shown by the dependent claims.

According to embodiments of the present invention, a first clock signal of a first (receiving) unit is synchronized to a second signal received from a second (transmitting) unit, wherein the second signal is one of: a clock signal or a data signal. A timing control signal is generated on the base of a phase difference between the first clock signal (receiver's clock) and the second signal (e.g. transmitter's clock or data signal) or a time difference between edges of said signals. The timing of the first clock signal is adjusted corresponding to the timing control signal, thus generating an adjusted clock signal that is used for sampling data received from the second unit.

As advantage, the information content of the timing control signal only changes slowly. Thus, the timing control signal is not to be handled as time critical. The information can e.g. be coded into a low speed data signal. This signal can be easily distributed to one or a plurality of receiver's clocks that have to be synchronized to the transmitter's clock.

In a further embodiment, the adjusted clock signal is used to sample a data signal received from the transmitting device.

In a further embodiment, the second signal is a clock signal received from the second unit. The adjusted clock signal is used to sample this clock signal and to check, whether the sampled result shows alternating high and low values, i.e. whether the sampled result is properly toggling.

In a further embodiment, the timing control signal is distributed from the first (receiving) unit to one or a plurality of further (receiving) units. The further units generate each their own further adjusted clock signals by each adjusting the phase of an own local clock signal corresponding to the timing control signal received. The corresponding adjusted clock signal(s) is/are used for each sampling (a) further data signal(s) received from the first (transmitting) unit.

In a further embodiment, the first units and the further unit are test channels of an automatic test equipment (ATE) and the second unit is a device under test (DUT), e.g. an integrated circuit. The automatic test equipment transmits stimulus data to a plurality of DUT pins and receives corresponding response data from a plurality of DUT pins. This data is sampled as described above and further compared with expected data.

In a further embodiment, the first clock signal, further also referred to as first channel clock signal and further channel clock signals are synchronized by means of a central clock located on (or accessible by) the automatic test equipment. Therefore, the central clock might generate a synchronization signal that is transmitted to the channel clocks.

In a further embodiment, the timing control signal is an analogue signal showing an amplitude that is preferably proportional to the phase difference of the adjusted clock signal and the second signal or to a time difference between edges of said signals. This value is used to control the timing of one or a plurality of corresponding clock signals generated by corresponding local clocks. In general, a phase difference at a specific data rate is equivalent to a time difference.

In a further embodiment, the timing control signal is a digital value, whereby the value corresponds e.g. to an absolute time value time difference (e.g. a difference time value to the last sample) or to a relative time value, wherein the time difference is related to the data or clock rate.

The phase of one channel clock signal is adjusted by means of a variable delay line connected between the corresponding channel clock unit and data signal buffer (flip-flop). The phase control unit provides a control value to the variable delay line that is based on the digital value and determined characteristics of the variable delay line.

It is clear that the invention can be partly or entirely embodied or supported by one or more suitable software programs, which can be stored on or otherwise provided by any kind of data carrier, and which might be executed in or by any suitable data processing unit.

BRIEF DESCRIPTION OF DRAWINGS

Other objects and many of the attendant advantages of embodiments of the present invention will be readily appreciated and become better understood by reference to the following more detailed description of further embodiments in connection with the accompanied drawings. Features that are substantially or functionally equal or similar will be referred to with the same reference signs.

Referring now in greater detail to the drawings, FIG. 1 shows an automatic test equipment (ATE) 200 and a device under test (DUT) 100. DUT 100 shows a DUT clock unit 130 comprising a phase locked loop (PLL) 131 and a reference clock unit 132. Further, DUT 100 shows by way of example one data signal driver 110 with a driver buffer (flip flop) 111 and an amplifier 112 connected to the output of the driver flip-flop 111. The data input of the driver flip-flop 111 is provided with response data S1 that is generated by the DUT in response to stimulus data not shown here. The clock input of the driver flip-flop is provided with a DUT clock signal DCLK generated by PLL 131. At each occurrence of a rising edge and/or a falling edge of clock signal DCLK the actual value of the response data S1 is taken over and passed to the output of driver flip flop 111 that provide this data to the input amplifier 112. The outputs of amplifier 112 provide DUT response data signal D1 further also referred to as first data signal D1, to ATE 200. Further, DUT clock signal DCLK is transmitted from DUT 100 to ATE 200.

Reference clock unit 132 provides a reference clock signal REF at (equal or different frequency) to PLL 131 that generates DUT clock signal DCLK (e.g. 10 Giga Hertz (GHz)).

Figure 1:
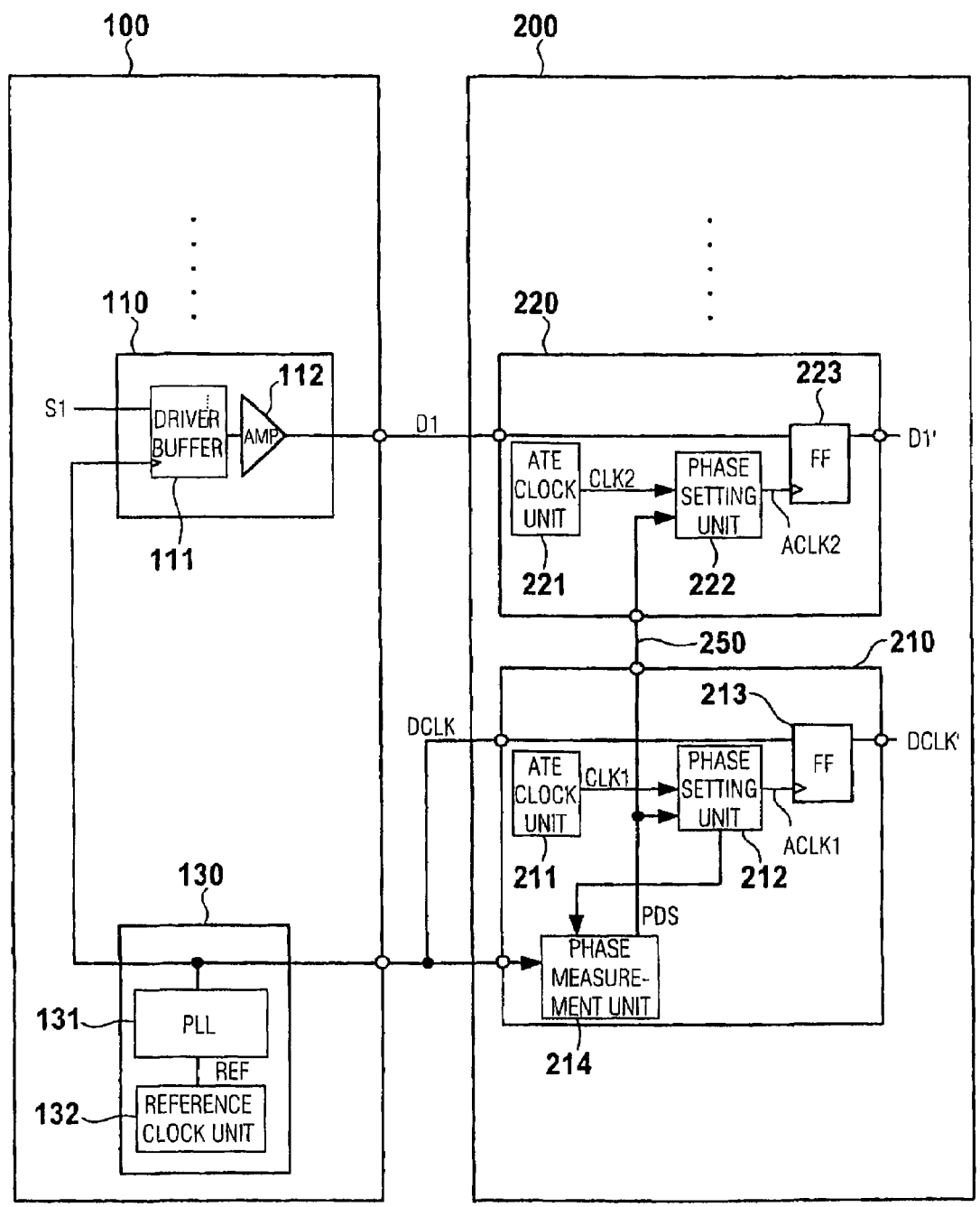
FIG. 1 shows a first variant of test system with a n automatic test equipment and a device under test with a clock synchronization according to the invention.

ATE 200 shows by way of example two test channels 210 and 220, that are each connected to one pin of the DUT and thus receive DUT clock signal DCLK and first data signal D1. In the example of FIG. 1, each test channel control one pin of the DUT, i.e. stimulating the corresponding pin and detecting the electrical response on the stimulus.

First test channel 210 further receives DUT clock signal DCLK. First test channel 210 comprises a first ATE (channel) clock unit 211, a first phase setting unit 212 a first receiver flip-flop 213 and a phase measurement unit 214. Phase measurement unit 214 receives at its inputs DUT clock signal DCLK and first adjusted clock signal ACLK 1 from first ATE clock unit 211. Preferably, both clock signals DCLK and CLK1 have the same frequency, but an arbitrary phase relation to each other. This is especially the case, if DUT clock signal DCLK is generated on the base of first clock signal CLK1 of the ATE (i.e. the ATE provides a master clock signal to the DUT). Phase measurement unit 214 determines a phase control signal PDS depending on the phase difference of first adjusted clock signal ACLK and DUT clock signal DCLK. Therewith a closed control loop is realized so that the phase control signal PDS shows a "0" or neutral value, if the phase difference between said clocks is eliminated.

Alternatively, for parametric measurements, each test channel can add an offset to the phase control signal.

In the example shown here, first test channel 210 serves exclusively for generating phase control signal PDS and for testing DUT clock DCLK. The adjusted clock signal ACLK1 is used to sample DUT clock signal DCLK and to check, whether the sampled result D CLK' shows alternating high and low values, i.e. whether the sampled result is properly toggling. However it is alternatively possible that also first test channel 210 is used for sampling a further data signal instead of testing DUT clock signal DCLK.

Phase control signal PDS can be an analogue signal with a signal amplitude (e.g. an electrical voltage or current) corresponding to the phase difference or the time delay between the clock signals. Alternatively, phase control signal PDS is a digital signal either comprising a numeric value corresponding to the phase difference or difference value to the last sample.

First local clock signal CLK1 from first ATE clock unit 211 and phase control signal PDS are both provided to inputs of first phase setting unit 212. First phase setting unit 212 takes first local clock signal CLK1 and adjusts the phase of this signal by providing a time delay to the signal so that an adjusted first local clock signal ACLK1 provided at the output of first phase setting unit is correctly in phase to DUT clock signal DCLK. Adjusted first local clock signal ACLK1 is provided to the clock input of first receiver flip-flop 213, thus storing (taking over) at the occurrence of each rising and/or falling edge of said clock signal the current data bit of first DUT response data signal D1 that is provided to the data input of said flip-flop. At the output of the flip-flop, a sampled response data signal D1'. Delay setting unit 212 might comprise a tunable delay line, comprising a plurality of delay elements with different delays, wherein switching different fixed delay elements together results in a certain delay.

Alternatively to directly forwarding DUT clock DCLK from the signal transmitter to the signal receiver, the clock signal is recovered from the data signal D1 on receiver's side. Depending from the modulation of the data bits (NRZ modulation or RZ modulation with a certain duty cycle) the clock signal can be extracted by carrying out an analysis on the data transitions. Preferably, a data scrambler or encoder is used at transmitter's side to ensure a certain transition density. Accordingly, a data de-scrambler is used at receiver's side.

Second test channel 220 is partly similar to first test channel 210, and differs in that only first test channel 210 receives DUT clock signal DCLK. Consequently, second test channel 220 does not comprise a phase measurement unit. However, also second test channel 220 needs the same clock signal for correctly sampling data signal D1. Therefore, second test channel 220 comprises a second ATE clock unit 221, a second phase setting unit 222 and a second receiver flip-flop 223.

It will be assumed here that first clock signal CLK1 and further clock signal CLK2 synchronous to each other, thus having the same phase and same frequency. Therefore, corresponding ATE channel clocks 211 and 221 might be synchronized by an ATE central clock unit not shown here. Examples for synchronizing different digital clocks in an ATE are e.g. disclosed European Application 04102923.2.

Generally, the invention also supports ATE clocks CLK1 and CLK2 running at different frequencies. In this case, phase control signal PDS preferably comprises time difference values instead of phase difference values. As discussed previously, a phase difference at a specific data rate is equivalent to a time difference.

For adjusting the second local clock signal CLK2 generated by second local clock unit 221, first test channel 210 transmits phase control signal PDS over a test channel interface 250 to second test channel 220. Corresponding to first channel 210, both second local clock signal CLK2 and phase control signal PDS are provided to inputs of second phase setting unit 222. Second phase setting unit 222 takes second local clock signal LCLK2 and adjusts the phase of this signal by providing the same time delay to the second local clock signal CLK2. A so adjusted second local clock signal ACLK2 is provided to the clock input of second receiver flip-flop 223, thus storing (taking over) at the occurrence of each rising and/or falling edge of said clock signal the current data bit of second DUT response data signal D1 that is provided to the data input of said flip-flop. At the output of the flip-flop, a recovered data signal D1' is present.

Further test channels only symbolized by dots and not expressively shown here may be provided for testing corresponding DUT pins also symbolized by dots.

Analyzing units not shown here comprised by the test channels compare the recovered data D1' with expected response data for determining whether the DUT 100 behaves in the expected way or whether errors occur. Thus, it can be ensured that the bit signals of the response signal from DUT 100 can be correctly sampled, so that temporal mismatches between the DUT responses and the expected response signal due to any kind of phase jitter or phase drifts, e.g. due to temperature variations in the DUT and/or the ATE, can be avoided.

Furthermore, the first clock signal (CLK1) and the further clock signal (CLK2) can be synchronized by a central clock of the automatic test equipment (200), not shown here.

In a test scenario, the ATE serves as a test master with a master clock and the DUT serves as test slave. Thus, reference clock signal REF is provided by the ATE to the DUT. Thus, the phase control measured on the ATE substantially is due to clock variations induced by the DUT (caused by temperature variations, cross talk etc.)

Figure 2:
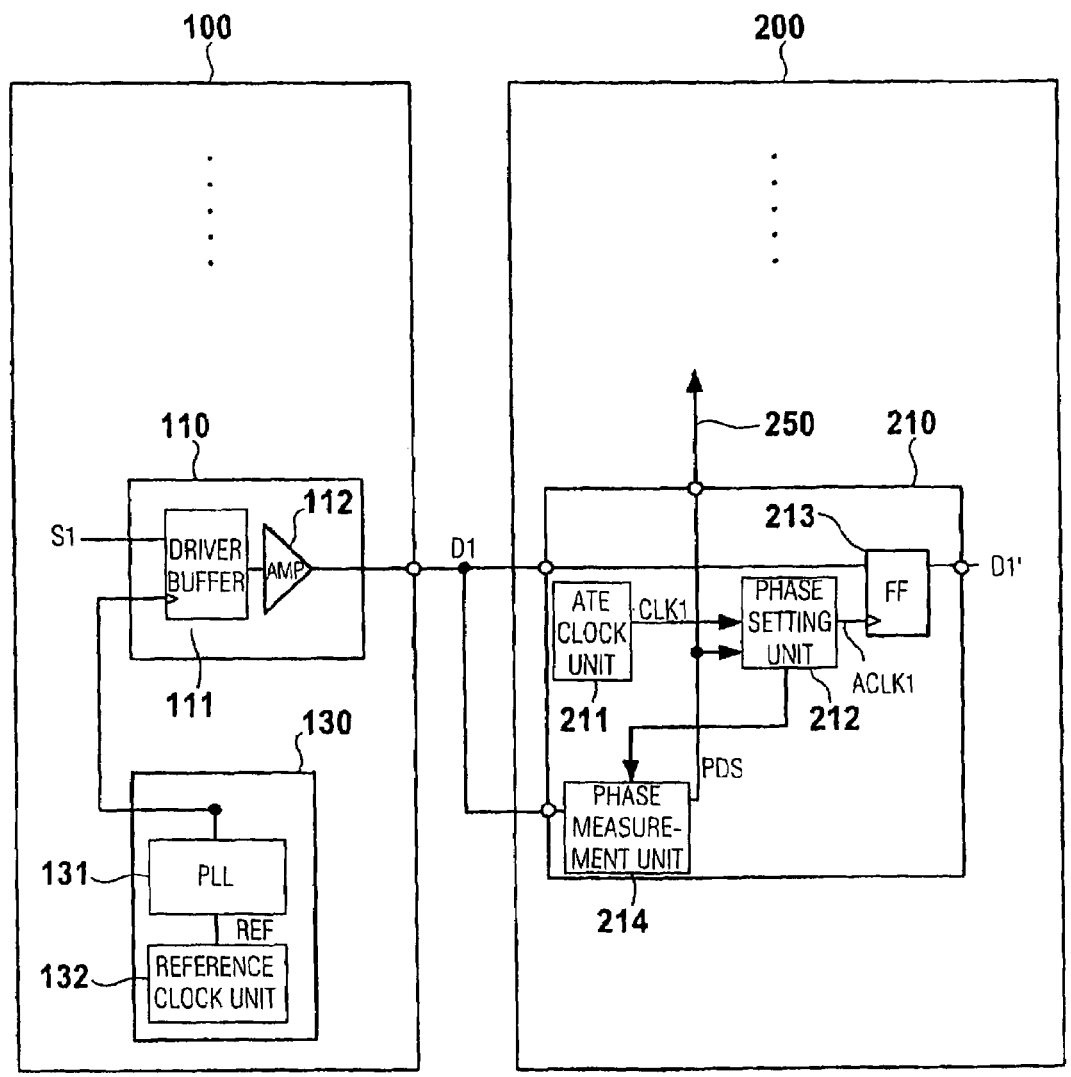
FIG. 2 shows a further variant of the test system of FIG. 1 wherein the automatic test equipment and the device under test are alternatively connected to each other.

FIG. 2 shows the automatic test equipment 200 and DUT 100 of FIG. 1, differently connected to each other compared to FIG. 1. First data signal D1 is provided to first test channel 210 instead of providing DUT clock signal DCLK to said test channel.

Preferably, a data scrambler or encoder (not shown here) is used at the output of data signal driver 110 of the DUT side to ensure a certain transition density. Accordingly, a data de-scrambler (not shown here) is provided at the inputs of first test channel 210 at ATE side.

In modern ATE systems, digital data is measured at very high speed, e.g. at up to 10 Gigabit per second (Gbit/s). Accordingly, a synchronizing clock must have high frequencies, e.g. 10 GHz. In order to be able to proper sample the digital data, clock signals need to be very accurate and clock edges must be sufficiently fast (steep). ATE systems as described above comprise a plurality of test channels that are e.g. grouped into groups of each 8 test channels. Each of those groups comprises one clock unit that receives the DUT clock signal, determines the phase control and distributes a corresponding phase control signal to the test channels of the corresponding group.

The invention has the advantage that e.g. the distribution of the phase control signal from the clock unit to the further units can be realized by low cost interfaces (e.g. cables and plugs) 250, because the phase control signal is a non-time critical low-speed signal. The low cost connections allow the ATE to be easy configurable to a wide range of different DUTs. Differently to an approach of coupling high-speed clock signal arbitrarily to different test channels, the inventive solution does not require expensive and bulky cables, switches and/or plugs.

According to the invention, only one test channel or a reduced number of test channels (e.g. each for one group of test channels out of groups with different sampling clocks as described above) need to be provided with the high-speed DUT clock signal DCLK. This (these) test channel(s) determine each a "slow" phase control signal PDS that can be provided over normal electrical connections (e.g. copper wires) to the other test channels. Flexibility thus can be easily achieved.

Figure 3:
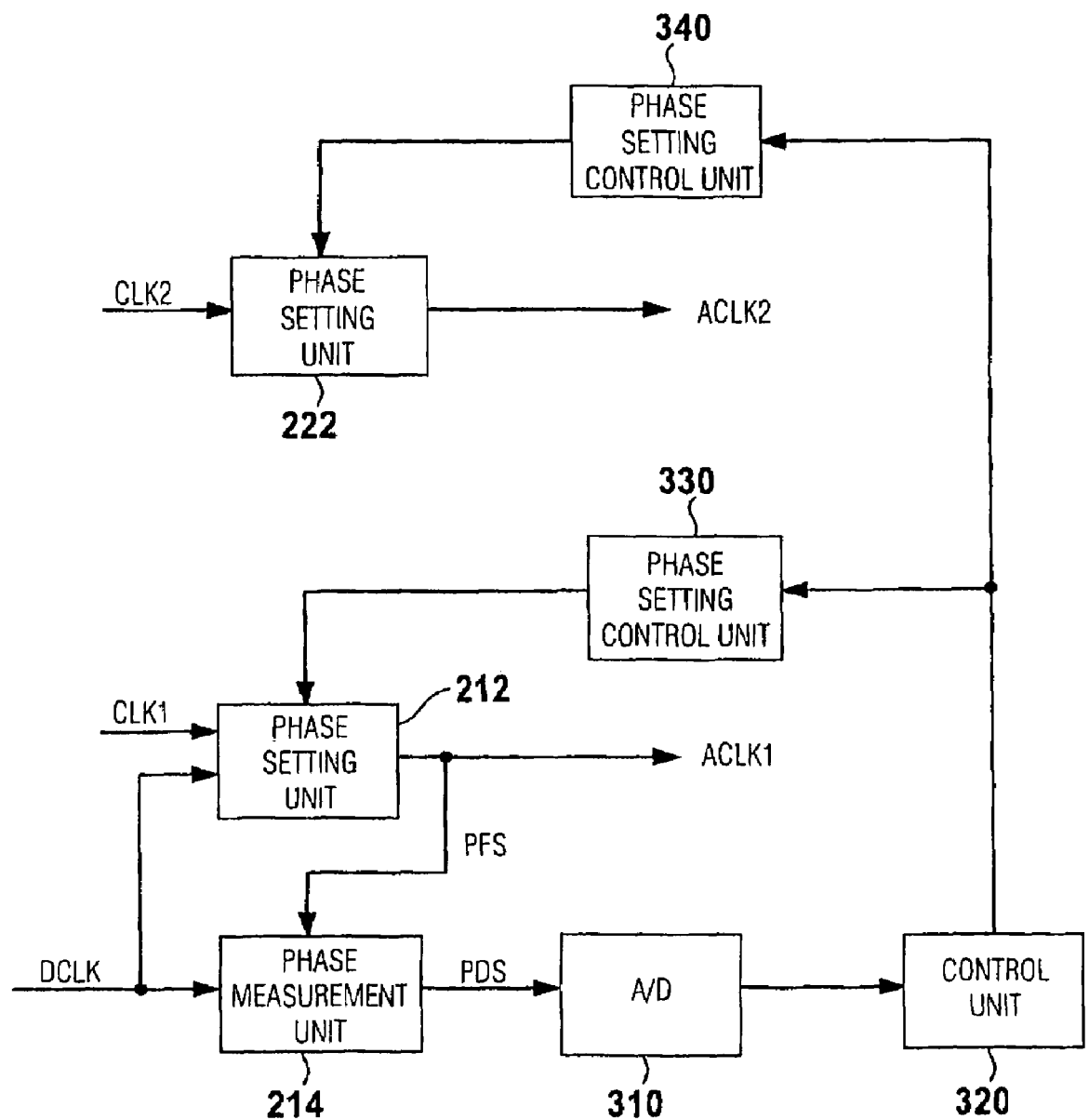
FIG. 3 shows a test system with an alternative automatic test equipment with a digital phase control.

In the following an embodiment of an ATE according to the invention with a digital phase control is described. Therefore, FIG. 3 shows an exemplary block diagram with selected functional blocks. Similar to FIG. 1, phase measurement unit 214 receives DUT clock signal DCLK and first adjusted clock signal ACLK1 and determines phase control signal PDS. This analogue signal is provided to an analog-to-digital (A/D) converter 310, that generates a digital value number corresponding to the voltage level of the phase control signal PDS. A/D converter 310 provides this digital number to a control unit 320 that generates a corresponding phase signal to be provided to the different test channels. In each receiving test channel a phase setting control unit 330 or 340 respectively 222 receive this phase signal comprising a digital value characterizing the requested delay (e.g. the requested delay value number of picoseconds or as a number of a fraction of a clock period). Each phase setting control unit 330 or 340 then controls corresponding phase setting units 212 or 222 so that the phase of the local clock signals CLK1 and CLK 2 are each accurately adjusted.

As described under FIG. 1, phase setting units 212 or 222 may comprise tunable delay lines with a plurality of switchable delay elements, wherein corresponding switches are set according to a desired delay value. However, such tunable delay limes cannot be manufacture with absolutely similar behavior. Thus the delay times of different delay lines might be slightly different when set with the same values (i.e. receive the same control signal). Therefore, phase setting control units 330 and 340 each comprise (or have access to) specific characterization data (e.g. stored in a look-up table) characterizing each the corresponding phase setting unit 212 or 220 respectively. Phase setting control units 330 and 340 thus take care of the correct setting of the controlled phase setting units 212 and 222 (i.e. choosing the individual delay setting control signal for a certain delay.

It is further possible to measure ambient conditions (e.g. temperature) and to take the measurement result into account when determining a control signal for setting a certain delay so that variations due to the ambient conditions are compensated for.

It is clear that the units in the block diagrams of FIGS. 1 and 2 only show functional modules that that be grouped to hardware in any combination (e.g. to integrate all functional modules of ATE 200 onto one hardware component or to provide for each module or even to split up the functions of one module into several hardware components). Thus it is e.g. possible either to integrate phase measurement unit 213 onto a test channel 210 or to provide an additional hardware component for phase measurement unit 213. It is further possible to realize each function solely by hardware or solely by software running on computers (controllers) or as a mixture of hardware and software.

The invention claimed is:

1. A method of source synchronous sampling, wherein a first clock signal of a first unit is synchronized to a second signal received from a second unit, comprising:
    determining a timing control signal on the base of the first clock signal and the second signal,
    generating an adjusted clock signal by adjusting the timing of the first clock signal corresponding to the timing control signal, and
    using the adjusted clock signal for sampling a signal received from the second unit,
    wherein the second signal is a clock signal received from the second unit,
    wherein the adjusted clock signal is used for sampling this clock signal itself, and
    wherein a corresponding sampled clock signal is supervised to show proper clock functionality.

2. The method of claim 1, wherein the timing control signal is distributed from the first unit to one or a plurality of further units, and wherein the further units generate each further adjusted clock signals by adjusting the phase of a further clock signals corresponding to the timing control signal, and wherein the further adjusted clock signals are used for sampling further data signals received from the second unit.

3. The method of claim 2, wherein the first unit and the one or the plurality of further units are test channels of an automatic test equipment, wherein the second unit is a device under test and wherein the automatic test equipment performs a test of the device under test by comparing sampled data with expected data.

4. The method of claim 3, wherein the first clock signal of a first test channel and the further clock signals of the further test channels are synchronized by a central clock of the automatic test equipment.

5. The method of claim 1, wherein the timing control signal is an analogue value that is proportional to one of: a phase difference between the adjusted clock signal and the second signal and a time difference between signal edges of the adjusted clock signal and the second signal.

6. The method of claim 1, wherein the timing control signal is a digital value comprising an information about one of: a phase difference between the adjusted clock signal and the second signal and a time difference between signal edges of the adjusted clock signal and the second signal.

7. The method of claim 6, wherein the digital value is generated by converting an analogue value that is proportional to the time or phase difference.

8. The method of claim 6, wherein the digital value is distributed to each a timing control unit of a plurality of units, wherein in each unit the timing of one clock signal is adjusted by a variable delay line connected between a local clock unit and a data signal buffer and wherein the timing control unit provides a control signal to the variable delay line that is based on the digital value and each specific characteristics of the variable delay line.

9. The method of claim 8, wherein the timing control unit comprises a look-up table wherein specific control signal values are assigned to digital values of the timing control signal.

10. The method of claim 1, wherein the adjusted clock signal is adjusted such that this clock signal has a certain time or phase offset with regard to the second signal.

11. A software program stored on a computer-readable medium, wherein the software program executes the method of claim 1, when run on a data processing system of an automatic test unit.

12. A testing unit for testing a device under test for source synchronous sampling by synchronizing a first clock signal of a first unit to a second signal received from the device under test, comprising:
    a measuring circuit for determining a phase difference between a first adjusted clock signal and a second signal, and generating a corresponding timing control signal,
    an adjustment circuit for generating a clock signal with an adjusted phase compared to the first clock signal, wherein the phase adjustment is based on the timing control signal, and
    a sampling circuit for generating sampled data by providing the adjusted clock signal to a trigger input and the data to be sampled to a data input of the sampling unit,
    wherein the second signal is a clock signal received from the device under test,
    wherein the adjusted clock signal is used for sampling this clock signal itself, and
    wherein a corresponding sampled clock signal is supervised to show proper clock functionality.

13. A method of source synchronous sampling, wherein a first clock signal of a first unit is synchronized to a second signal received from a second unit, comprising:
    determining a timing control signal on the base of the first clock signal and the second signal,
    generating an adjusted clock signal by adjusting the timing of the first clock signal corresponding to the timing control signal, and
    using the adjusted clock signal for sampling a signal received from the second unit,
    wherein the second signal is a clock signal recovered from a data signal, and
    wherein the first unit recovers the clock signal from the data signal by performing an analysis on the transitions of the data signal.

14. A software program stored in a computer-readable medium, wherein the software program executes the method of claim 13, when run on a data processing system of an automatic test unit.

15. A testing unit for testing a device under test for source synchronous sampling by synchronizing a first clock signal of a first unit to a second signal received from the device under test, comprising:
    a measuring circuit for determining a phase difference between a first adjusted clock signal and a second signal, and generating a corresponding timing control signal,
    an adjustment circuit for generating a clock signal with an adjusted phase compared to the first clock signal, wherein the phase adjustment is based on the timing control signal, and
    a sampling circuit for generating sampled data by providing the adjusted clock signal to a trigger input and the data to be sampled to a data input of the sampling unit,
    wherein the second signal is a clock signal recovered from a data signal, and
    wherein the first unit recovers the clock signal from the data signal by performing an analysis on the transitions of the data signal.

* * * * *